United States Patent
Boyer et al.

(10) Patent No.: US 7,810,012 B1
(45) Date of Patent: Oct. 5, 2010

(54) FORMAT FOR RANDOMIZED DATA BLOCK IN A STORAGE DEVICE

(75) Inventors: Keith Gary Boyer, Broomfield, CO (US); Thomas G. Liehe, Denver, CO (US)

(73) Assignee: Oracle America, Inc., Redwood City, CA (US)

( * ) Notice: Subject to any disclaimer, the term of this patent is extended or adjusted under 35 U.S.C. 154(b) by 1782 days.

(21) Appl. No.: 10/635,146

(22) Filed: Aug. 6, 2003

(51) Int. Cl.
*H03M 13/00* (2006.01)
(52) U.S. Cl. .................. 714/758; 714/770; 714/728
(58) Field of Classification Search ............... 714/758, 714/769, 770, 771, 739, 728, 761; 711/207, 711/173; 360/40, 48
See application file for complete search history.

(56) References Cited

U.S. PATENT DOCUMENTS

| | | | | |
|---|---|---|---|---|
| 4,064,558 A | * | 12/1977 | Hughes et al. .............. 711/207 |
| 4,993,029 A | * | 2/1991 | Galbraith et al. ............ 714/769 |
| 5,602,857 A | * | 2/1997 | Zook et al. .................. 714/769 |
| 5,712,740 A | * | 1/1998 | Kikuchi et al. ................ 360/48 |
| 5,809,558 A | * | 9/1998 | Matthews et al. ........... 711/173 |
| 6,392,829 B1 | * | 5/2002 | Stoutenburgh et al. ........ 360/39 |
| 6,400,824 B1 | * | 6/2002 | Mansoorian et al. ........ 380/269 |
| 6,543,024 B2 | * | 4/2003 | Gray .......................... 714/769 |
| 6,597,526 B1 | * | 7/2003 | Gray .......................... 360/40 |
| 2001/0040901 A1 | * | 11/2001 | Kotani et al. ................. 370/498 |

* cited by examiner

*Primary Examiner*—Rehana Perveen
*Assistant Examiner*—Fritz Alphonse
(74) *Attorney, Agent, or Firm*—Brooks Kushman P.C.

(57) ABSTRACT

An improved format is disclosed for storing a randomized data block in a storage device. The data block format includes a data field, an identifier (ID) field for storing an identifier that identifies data stored in the data field, and a randomizer seed field for storing a randomizer seed. An error check character generator generates an ID field error check character utilizing said identifier. The randomizer seed includes the ID field error check character.

13 Claims, 2 Drawing Sheets

FORMAT FOR RANDOMIZED DATA BLOCK IN A STORAGE DEVICE

BACKGROUND OF THE INVENTION

1. Field of the Invention

The present invention relates generally to data storage devices and particularly to an improved format for a randomized data block.

2. Background of the Invention

Most modern tape and disk storage devices record data in blocks of information. These blocks are often randomized in order to meet recording constraints. If the blocks are not randomized, particular run lengths may occur in the blocks that would increase the likelihood of recording and read back errors.

FIG. 1 is a block diagram of a format 100 for a randomized data block in accordance with the prior art. The data block format 100 includes a randomizer seed field 102, an ID field 104, an ID field CRC 106, a data field 108, and a block error detection and correction (EDC) field 110. Randomizer seed field 102 is a particular width and is used to store a randomizer seed. The randomizer seed is a random number that is sized to occupy the entire width of randomizer seed field 102.

ID field 104 is used to store an identifier for the data that will be stored in data field 108. An ID field error checking character, such as a CRC, will be generated using the identifier that is stored in ID field 104. The ID field CRC will be stored in its own field, ID field CRC field 106. ID field CRC is used as an additional layer of error checking in order to ensure that the identifier that is stored in ID field 104 is correct. It is very helpful to know whether the identifier stored in ID field 104 is correct prior to getting the data from data field 108. Using an incorrect identifier can create many problems. For example, if the identifier is an address into memory, it is important to make sure the address is correct before altering a memory location.

A block error detection and correction character (EDC) field 110 is also included in the data block. The block EDC is used to detect and correct errors that might occur in the entire data block.

The prior art data block is generated as follows. Data is received and stored in data field 108. An identifier is received and stored in ID field 104. An ID field CRC is generated using the identifier stored in ID field 104. The ID field CRC is then stored in ID field CRC field 106.

A random number is generated that will be used as the randomizer seed. Randomizer seed field 102 is a particular width. The random number that is generated will be this same particular width in order to occupy the entire randomizer seed field 102. The random number is then stored in the randomizer seed field 102.

The combination of the identifier stored in ID field 104, the CRC stored in ID field CRC field 106, and the data stored in data field 108 are randomized using the random number stored in randomizer seed field 102. Error detection and correction is then performed to generate an EDC over the combination of the random number stored in randomizer seed field 102, the identifier stored in ID field 104, the CRC stored in ID field CRC field 106, and the data stored in data field 108. The generated EDC is then stored in block EDC field 110.

The prior art provides for a data block format that includes a separate field for storing the ID field CRC. The separate field is added to each data block. As the amount of data to be stored increases, a larger portion of the storage device must be devoted to providing this separate field for every data block.

Therefore, the current technology would be improved by reducing the size of each data block by utilizing a format for storing a randomized data block that does not require separate space for storing an identifier error checking character.

SUMMARY OF THE INVENTION

An improved format is disclosed for storing a randomized data block in a storage device. The data block format includes a data field, an identifier (ID) field for identifying data stored in the data field, and a randomizer seed field for storing a randomizer seed. An error check character generator generates an ID field error check character utilizing said identifier. The randomizer seed includes the ID field error check character.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
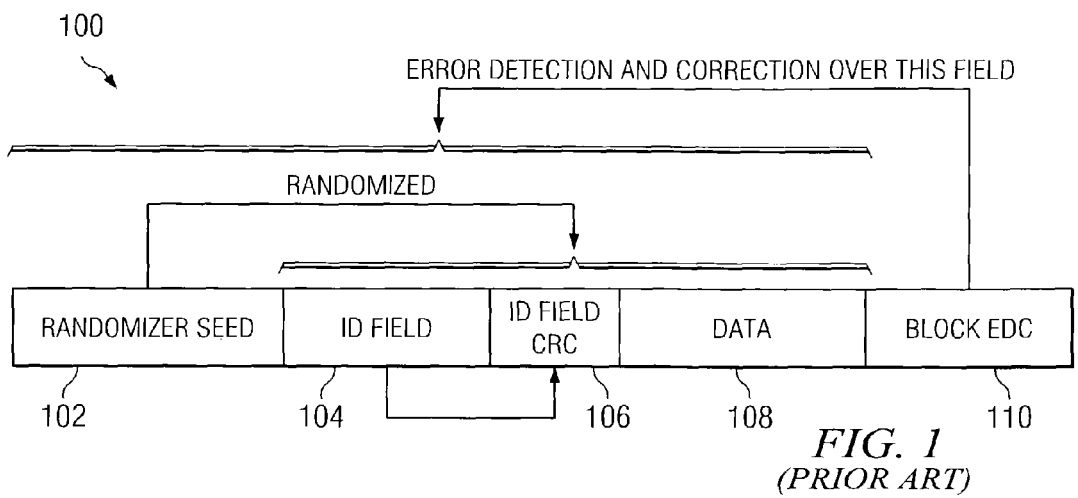
FIG. 1 is a block diagram of a format for a randomized data block in accordance with the prior art.
Figure 2:
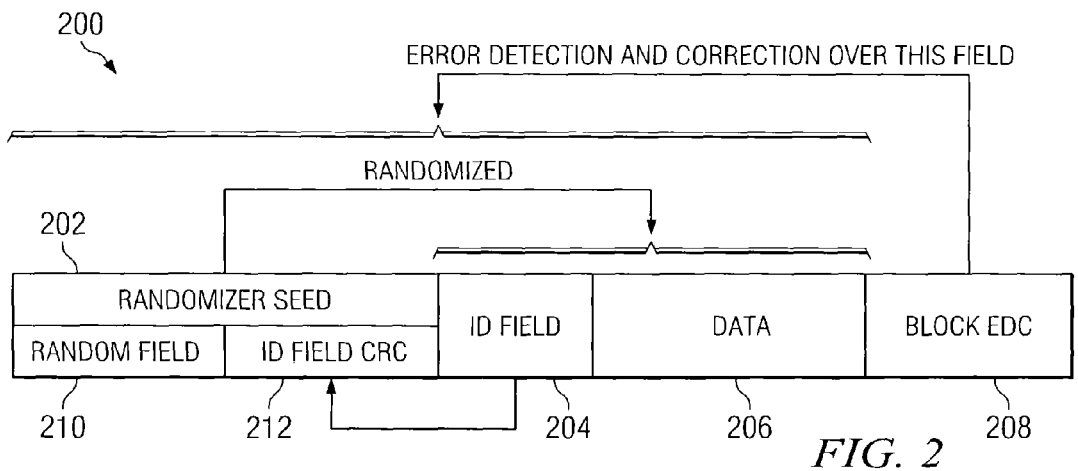
FIG. 2 is a block diagram of an improved format for a randomized data block in accordance with the present invention.

FIG. 2 is a block diagram of an improved format for a randomized data block in accordance with the present invention. The data block format 200 includes a randomizer seed field 202, an ID field 204, a data field 206, and a block EDC field 208. Randomizer seed field 202 is a particular width and is used to store a randomizer seed. According to an important feature of the present invention, randomizer seed field is the same width as in the prior art, but, unlike the prior art, is divided into two portions, a random field 210 and an ID field CRC field 212. The randomizer seed of the present invention will be the number that is stored in the entire width of randomizer seed field 202. The randomizer seed will include a random number and an ID field CRC. This is described in more detail below.

ID field 204 is used to store an identifier for the data that will be stored in data field 206. An ID field error checking character, such as a CRC, will be generated using the identifier that is stored in ID field 204. According to an important feature of the present invention, the ID field CRC will not be stored in its own field. ID field CRC will be included as part of randomizer seed field 202. The size of randomizer seed field 202 will not be changed in order to accommodate ID field CRC. Instead, the original size of randomizer seed field 202 will be divided into two portions. One portion will be used to store the random number while the second portion will be used to store the ID field CRC.

A block error detection and correction character (EDC) field 208 is also included in the data block. The block EDC is used to detect and correct errors that might occur in the entire data block.

Figure 3:
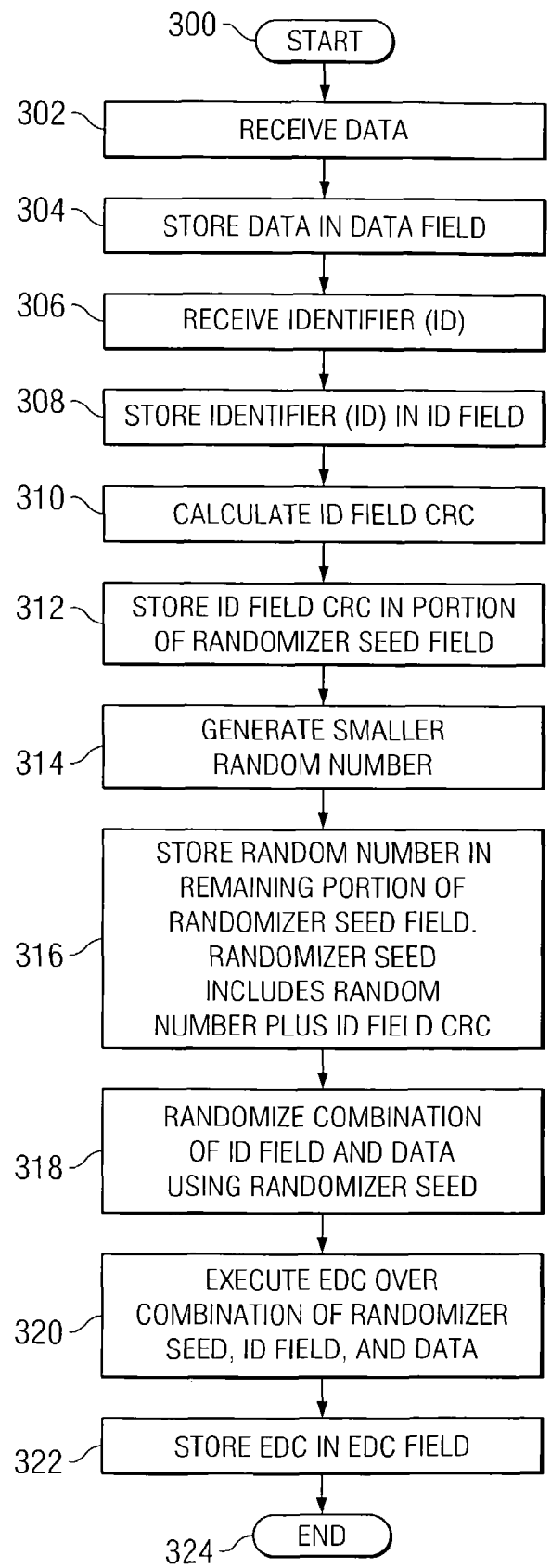
FIG. 3 depicts a high level flow chart that illustrates utilizing a randomizer seed that includes an ID field CRC to randomize a data block in accordance with the present invention.

FIG. 3 depicts a high level flow chart that illustrates utilizing a randomizer seed that includes an ID field CRC to randomize a data block in accordance with the present invention. The process starts as depicted by block 300 and thereafter passes to block 302 which illustrates receiving data. Next, block 304 depicts storing the data in data field 206. The process then passes to block 306 which illustrates receiving an identifier (ID). Block 308, then, depicts storing the identifier in ID field 204.

Thereafter, block 310 illustrates calculating an ID field CRC. Next, block 312 depicts storing the ID field CRC in a portion 212 of the existing, original sized, randomizer seed field 202. The process then passes to block 314 which illustrates generating a random number that is smaller than the randomizer seed field 202. Thus, this random number is smaller than the random number that was calculated in the prior art although the randomizer seed field is the same size as in the prior art.

Block 316, then, depicts storing the random number in the remaining portion 210 of randomizer seed field 202. Thereafter, block 318 illustrates randomizing the combination of the identifier that is stored in ID field 204 and the data that is stored in data field 206. Next, block 320 depicts executing error correction and detection over the combination of the randomizer seed, including the random number and ID field CRC, that is stored in randomizer seed field 202, the identifier that is stored in ID field 204, and the data that is stored in data field 206. Block 322, then, illustrates storing the EDC in block EDC field 208. The process then terminates as depicted by block 324.

Figure 4:
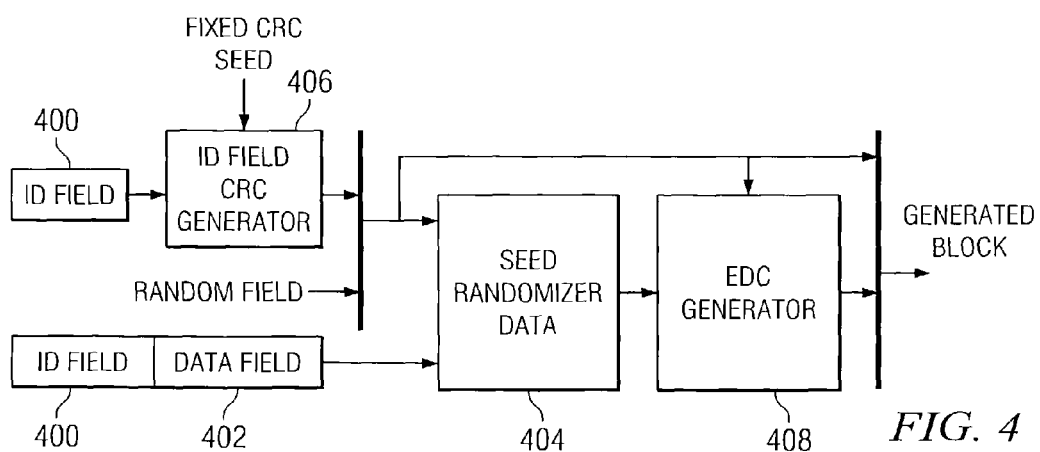
FIG. 4 is a block diagram that depicts a randomizer and EDC generator for storing data in an improved data block format in accordance with the present invention.

FIG. 4 is a block diagram that depicts a randomizer and EDC generator for storing data in an improved data block format in accordance with the present invention. The identifier that is stored in ID field 400 and the data that is stored in data field 402 are provided as data to a randomizer 404. The identifier that is stored in ID field 400 is also provided to an error check character generator such as ID field CRC generator 406. ID field CRC generator 406 generates an ID field CRC from the identifier that is stored in ID field 400. The ID field CRC is then provided along with a random number to randomizer 404. The combination of the random number and ID field CRC is used by randomizer as a randomizer seed. Randomizer 404 then randomizes its data, which is the combination of the identifier stored in ID field 400 and the data stored in data field 402, using the randomizer seed. An EDC generator 408 then receives as its inputs the randomizer seed, identifier stored in ID field 400, and data stored in data field 402. EDC generator 408 generates an EDC using the randomizer seed, identifier stored in ID field 400, and data stored in data field 402.

The present invention reduces the size of each data block by dividing the existing randomizer seed field into two portions. Thus, according to the present invention, the bits of the randomizer seed field are divided into two portions. Some of the bits of the randomizer seed field will be used to store the ID field CRC instead of storing a random number.

One portion of the randomizer seed field will be used to store a random number while the second portion will be used to store the ID field CRC. Since the randomizer seed field size does not change, i.e. it has the same number of bits as before it was divided, the overall size of the data block is reduced because the original ID field CRC field is eliminated.

The only requirement for generating a randomizer seed is that the randomizer seed be stochastically independent of the data. Since the identifier that is stored in the ID field is different for each data block, that portion of the randomizer seed that includes the ID field CRC will also be different for each data block. The remaining portion of the randomizer seed field may be used to store a random number that is smaller than the random number generated in the prior art.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A system for generating a randomized data block, said randomized data block including a data field for storing data, an identifier (ID) field for storing an identifier that identifies said data stored in said data field, and a randomizer seed field for storing a randomizer seed that includes an ID field error check character, the system comprising:
    an error check character generator for generating said ID field error check character utilizing said identifier; and
    a randomizer for randomizing said identifier stored in said ID field and said data stored in said data field utilizing said randomizer seed, wherein said identifier stored in said ID field and said data stored in said data field are randomized utilizing said ID field error check character stored in said randomizer seed field.

2. The system according to claim 1, further comprising:
    an error detection and correction (EDC) generator for generating an EDC block utilizing said randomizer seed, said identifier, and said data.

3. A method for generating a randomized data block, the method comprising the steps of:
    storing data in a data field;
    storing an identifier in an identifier (ID) field that identifies said data;
    generating an ID field error check character utilizing said identifier;
    storing a randomizer seed in a randomizer seed field, said randomizer seed including said ID field error check character; and
    randomizing said identifier stored in said ID field and said data stored in said data field utilizing a randomizer and said randomizer seed, wherein said identifier stored in said ID field and said data stored in said data field are randomized utilizing said ID field error check character.

4. The method according to claim 3, further comprising the steps of:
    dividing said randomizer seed field into a first portion for storing a random number and a second portion for storing said ID field error check character.

5. The method according to claim 3, further comprising the steps of:
    said randomizer seed field including a particular number of bits;
    storing said ID field error check character in a first plurality of said particular number of bits.

6. The method according to claim 5, further comprising the steps of:

storing a random number in a first plurality of said particular number of bits.

7. The method according to claim 3, further comprising the steps of:

generating an EDC block utilizing said randomizer seed, said identifier, and said data and an error detection and correction (EDC) generator.

8. The method according to claim 3, further comprising the steps of:

storing said identifier as part of said randomizer seed, said format not including a separate field for storing said identifier.

9. A randomized data block comprising:

a data field for storing data;

an identifier (ID) field for storing an identifier that identifies said data;

an ID field error check character generated by utilizing said identifier; and a randomizer seed field for storing a randomizer seed, said randomizer seed including said ID field error check character, wherein said identifier stored in said ID field and said data stored in said data field are randomized utilizing a randomizer and said randomizer seed and wherein said identifier stored in said ID field and said data stored in said data field are randomized utilizing said ID field error check character.

10. The data block according to claim 9, further comprising:

said randomizer seed field being divided into a first portion for storing a random number and a second portion for storing said ID field error check character.

11. The data block according to claim 9, further comprising:

said randomizer seed field including a particular number of bits;

a first plurality of said particular number of bits for storing said ID field error check character.

12. The data block according to claim 11, further comprising:

a first plurality of said particular number of bits for storing a random number.

13. The data block according to claim 9, further comprising:

wherein said identifier is stored as part of said randomizer seed.

\* \* \* \* \*